(12) United States Patent
Williams et al.

(10) Patent No.: US 8,890,600 B1
(45) Date of Patent: Nov. 18, 2014

(54) BUS SHARING SCHEME

(71) Applicant: Cypress Semiconductor Corporation, San Jose, CA (US)

(72) Inventors: Timothy J. Williams, Bellevue, WA (US); Harold Kutz, Edmonds, WA (US); David G. Wright, Woodinville, CA (US); Eashwar Thiagarajan, Bothell, WA (US); Warren S. Snyder, Snohomish, WA (US); Mark E. Hastings, Mukilteo, WA (US)

(73) Assignee: Cypress Semicondductor Corporation, San Jose, CA (US)

( * ) Notice: Subject to any disclaimer, the term of this patent is extended or adjusted under 35 U.S.C. 154(b) by 0 days.

(21) Appl. No.: 13/893,201

(22) Filed: May 13, 2013

Related U.S. Application Data

(63) Continuation of application No. 12/496,579, filed on Jul. 1, 2009, now Pat. No. 8,441,298.

(60) Provisional application No. 61/077,466, filed on Jul. 1, 2008.

(51) Int. Cl.
*H03L 5/00* (2006.01)

(52) U.S. Cl.
USPC ............. 327/333; 327/564; 327/565; 326/41; 326/47

(58) Field of Classification Search
USPC ........................ 327/333, 565, 564; 326/41, 47
See application file for complete search history.

(56) References Cited

U.S. PATENT DOCUMENTS

| | | |
|---|---|---|
| 5,079,451 A | 1/1992 | Gudger et al. |
| 5,412,261 A | 5/1995 | Whitten |
| 5,424,589 A | 6/1995 | Dobbelaere et al. |
| 5,563,526 A | 10/1996 | Hastings et al. |
| 5,598,408 A | 1/1997 | Nickolls et al. |
| 5,625,301 A | 4/1997 | Plants et al. |
| 5,635,745 A | 6/1997 | Hoeld |
| 5,671,432 A | 9/1997 | Bertolet et al. |
| 5,778,439 A | 7/1998 | Trimberger et al. |
| 5,894,565 A | 4/1999 | Furtek et al. |
| 5,966,047 A | 10/1999 | Anderson et al. |
| 6,246,259 B1 | 6/2001 | Zaliznyak et al. |
| 6,460,172 B1 | 10/2002 | Insenser Farre et al. |
| 6,583,652 B1 | 6/2003 | Klein et al. |
| 6,701,340 B1 | 3/2004 | Gorecki et al. |

(Continued)

FOREIGN PATENT DOCUMENTS

| | | |
|---|---|---|
| EP | 0871223 A | 10/1998 |
| EP | 1713252 A | 10/2006 |

OTHER PUBLICATIONS

"PSoC Mixed-Signal Array Technical Reference Manual," Cypress Semiconductor Corporation, Oct. 14, 2008.

(Continued)

*Primary Examiner* — Kenneth B. Wells

(57) ABSTRACT

A programmable device, having an analog component coupled with an analog bus and a digital component coupled with a digital bus together with a set of IO pads, each of which capable of being coupled to a bus line of one segment of the analog bus as well as to at least one digital bus line, and where the analog bus is capable of being used to connect a pair of the IO pads to each other.

20 Claims, 10 Drawing Sheets

(56) References Cited

U.S. PATENT DOCUMENTS

| | | | |
|---|---|---|---|
| 6,724,220 B1 | 4/2004 | Snyder et al. | |
| 6,895,530 B2 | 5/2005 | Moyer et al. | |
| 6,971,004 B1 | 11/2005 | Pleis et al. | |
| 6,981,090 B1 | 12/2005 | Kutz et al. | |
| 7,046,035 B2 | 5/2006 | Piasecki et al. | |
| 7,173,347 B2 | 2/2007 | Tani et al. | |
| 7,212,189 B2 | 5/2007 | Shaw et al | |
| 7,266,632 B2 | 9/2007 | Dao et al. | |
| 7,287,112 B1 | 10/2007 | Pleis et al. | |
| 7,308,608 B1 | 12/2007 | Pleis et al. | |
| 7,340,693 B2 | 3/2008 | Martin et al. | |
| 7,360,005 B2 | 4/2008 | Lin | |
| 7,436,207 B2 | 10/2008 | Rogers et al. | |
| 7,552,415 B2 | 6/2009 | Sanchez et al. | |
| 7,581,076 B2 | 8/2009 | Vorbach | |
| 7,609,178 B2 | 10/2009 | Son et al. | |
| 7,613,943 B2 | 11/2009 | Bakker et al. | |
| 7,865,847 B2 | 1/2011 | Master | |
| 8,026,739 B2 | 9/2011 | Sullam et al. | |
| 8,099,618 B2 | 1/2012 | Vorbach et al. | |
| 8,179,161 B1 | 5/2012 | Williams et al. | |
| 8,441,298 B1 * | 5/2013 | Williams et al. | 327/333 |
| 2002/0191029 A1 | 12/2002 | Gillespie et al. | |
| 2003/0067919 A1 | 4/2003 | Qiao et al. | |
| 2004/0141392 A1 | 7/2004 | Lee et al. | |
| 2007/0214389 A1 | 9/2007 | Severson et al. | |

OTHER PUBLICATIONS

U.S. Appl. No. 12/773,801 "Debug Through Power Down," Amsby Richardson Jr et al., filed May 4, 2010; 120 pages.

U.S. Appl. No. 12/776,323 "Dynamically Reconfigurable Analog Routing Circuits and Methods for System on a Chip," Bert Sullam et al., filed May 7, 2010; 46 pages.

David C. Walter, "Verification of Analog and Mixed-Signal Circuits using Symbolic Methods," A Dissertation Submitted to the Faculty of the University of Utah, Aug. 2007; 134 pages.

International Search Report for International Application No. PCT/US10/34185 dated Sep. 7, 2010; 2 pages.

Kundert et al., "Design of Mixed-Signal Systems on Chip," IEEE Transactions on CAS, vol. 19, No. 12, Dec. 2000, pp. 1561-1572; 12 pages.

USPTO Advisory Action for U.S. Appl. No. 12/776,323 dated Jan. 8, 2013; 2 pages.

USPTO Final Rejection for U.S. Appl. No. 12/773,801 dated Jan. 23, 2013; 12 pages.

USPTO Final Rejection for U.S. Appl. No. 12/774,680 dated Aug. 3, 2011; 11 pages.

USPTO Final Rejection for U.S. Appl. No. 12/776,323 dated Oct. 4, 2012; 22 pages.

USPTO Non-Final Rejection for U.S. Appl. No. 12/773,801 dated Jun. 22, 2012; 11 pages.

USPTO Non-Final Rejection for U.S. Appl. No. 12/774,680 dated Feb. 18, 2011; 8 pages.

USPTO Non-Final Rejection for U.S. Appl. No. 12/774,680 dated Jul. 10, 2012; 11 pages.

USPTO Non-Final Rejection for U.S. Appl. No. 12/774,680 dated Dec. 22, 2011; 11 pages.

USPTO Non-Final Rejection for U.S. Appl. No. 12/776,323 dated Jun. 28, 2012; 18 pages.

USPTO Notice of Allowance for U.S. Appl. No. 12/774,680 dated Jan. 31, 2013; 7 pages.

USPTO Notice of Allowance for U.S. Appl. No. 12/774,680 dated May 28, 2013; 8 pages.

USPTO Notice of Allowance for U.S. Appl. No. 12/774,680 dated Oct. 22, 2012; 7 pages.

USPTO Notice of Allowance for U.S. Appl. No. 12/774,680 dated Dec. 21, 2012; 7 pages.

USPTO Requirement Restriction for U.S. Appl. No. 13/893,201 dated Oct. 22, 2013; 6 pages.

Written Opinion of the International Searching Authority for International Application No. PCT/US10/34185 mailed Sep. 7, 2010; 5 pages.

USPTO Advisory Action for U.S. Appl. No. 12/496,579 dated Aug. 4, 2011; 3 pages.

USPTO Final Rejection for U.S. Appl. No. 12/496,579 dated Jan. 24, 2012; 13 pages.

USPTO Final Rejection for U.S. Appl. No. 12/496,579 dated Jun. 7, 2011; 11 pages.

Non Final Rejection for U.S. Appl. No. 12/776,323 dated Jan. 31, 2014; 24 pages.

Non-Final Rejection for U.S. Appl. No. 12/496,579 dated Jan. 25, 2011; 11 pages.

Non-Final Rejection for U.S. Appl. No. 12/496,579 dated Sep. 5, 2012; 21 pages.

Non-Final Rejection for U.S. Appl. No. 12/496,579 dated Sep. 20, 2011; 12 pages.

Notice of Allowance for U.S. Appl. No. 12/496,579 dated Nov. 8, 2012; 7 pages.

Requirement for Restriction for U.S. Appl. No. 12/496,579 dated Nov. 30, 2010; 6 pages.

SIPO Chinese Office Action for Application No. 201080030381.8 dated Feb. 17, 2014; 6 pages.

* cited by examiner

Transmission gate examples
(for switches to the analog lines)

NMOS only
connection to
analog line

NMOS + PMOS
connection to
analog line

BUS SHARING SCHEME

This application is a continuation of U.S. application Ser. No. 12/496,579 filed Jul. 1, 2009, which claims priority to U.S. Application No. 61/077,466, filed Jul. 1, 2008, both of which are incorporated herein by reference in their entirety.

TECHNICAL FIELD

This disclosure relates generally to analog circuits, and more particularly to sharing buses in the analog domain.

BACKGROUND

Buses having a plurality of lines connect circuit components to each other, as well as to input and output ports. Utilizing one line for each possible interconnection can result in a great number of lines. Each line consumes device space, i.e. real estate, both for the line itself and for spacing around the line.

SUMMARY

The following is a summary of embodiments of the invention in order to provide a basic understanding of some aspects. This summary is not intended to identify key/critical elements of the embodiments or to delineate the scope of the embodiments. Its sole purpose is to present some concepts in a simplified form as a prelude to the more detailed description that is presented later.

In one example, transmission gates selectively connect a plurality of General Purpose Input Output (GPIO) pads to a bus line of an analog bus. Alternating selective connections between the transmission gates allows the GPIO pads to share the bus line, saving real estate in an embodiment. The transmission gates may also be controlled in other ways to provide dynamic configuration of the circuit, such as connecting the GPIO pads to each other over the bus line.

DETAILED DESCRIPTION OF EXAMPLE EMBODIMENTS

Several examples of the present application will now be described with reference to the accompanying drawings. Various other examples of the invention are also possible and practical. This application may be exemplified in many different forms and should not be construed as being limited to the examples set forth herein.

Figure 1A:
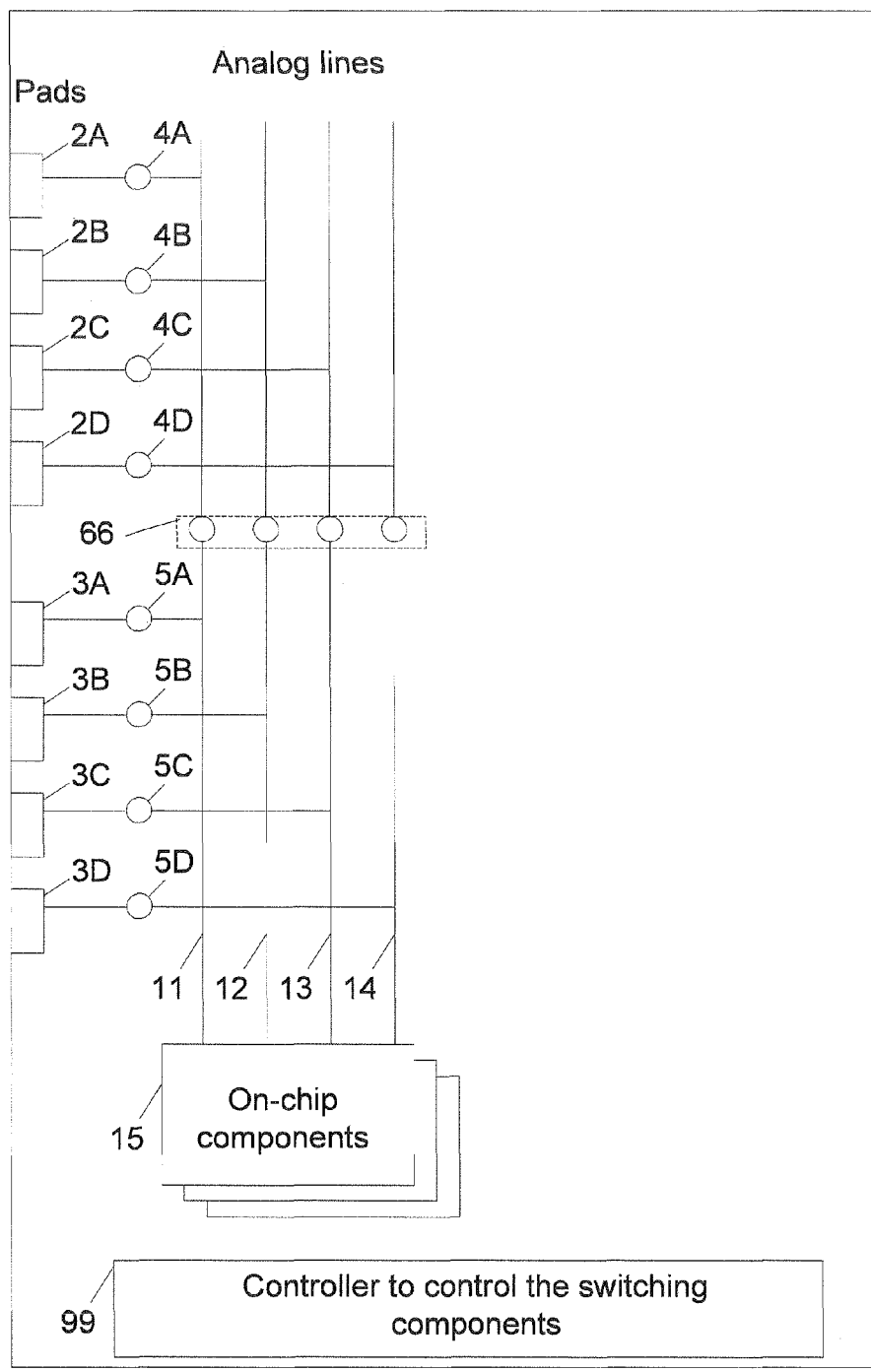
FIG. 1A shows a system utilizing a plurality of switches to share analog lines between I/O ports in an embodiment.

FIG. 1A shows a system 100 utilizing a plurality of switches to share analog lines between I/O ports in an embodiment.

Unlike some circuits where there is a one-to-one correspondence between bus lines and General Purpose Input/Output (GPIO) ports, the example system 100 has a plurality of GPIO pads selectively connected to each bus line. For example, the pads 2A and 3A are both selectively connected to bus line 11 via transmission gates 4A and 5A respectively. It is noted that the bus lines can be connected to analog components such as, but not limited to, ADCs, DACs, comparators, etc.

It should be appreciated that the above-described concept may save real estate. For example, in a another system with eight GPIO pads, eight bus lines are specified. In the present example, four bus lines are used for the eight GPIO pads 2A-2D and 3A-D due to the switching scheme. For example, bus line 11 can be used by either of the pads 2A or 3A, at any given time.

In an embodiment, one bus line is connected to multiple ports simultaneously. For example, both switches 4A and 5A can be closed at the same time to connect bus line 11 to both pads 2A and 3A.

Alternatively, both pads 2A and 3A can be simultaneously opened to disconnect both of these pads 2A and 3A. This could be used to free up the bus line 11 to send signals between internal components 15 (either analog or digital or both) that are also selectively connected to the bus line 11. In other words, the bus line 11 is not only shared between I/O ports, but also can be shared with internal components 15 using the switching scheme.

The switching scheme described above can be further extended by adding additional switching components along the bus lines 11-14 themselves. For example, switches can be added at the dashed box 66. These switches, if added, break each of the bus lines 11-14 into sub bus lines that can be combined by closing a respective one of the switching components of dashed box 66. Such switches could allow, for example, pads 2A and 3A to connect to different sub bus lines at one time, but connect to each other through joined sub bus lines at another time.

It should be understood that the transmission gates 4A-D and 5A-5D can be controlled in any known fashion. For example, registers could be arranged for each gate and set or unset according to a request (whether generated by a user or an internal component). Or in other examples, an internal logic function controls the transmission gates. Or in another example, some portion of the transmission gates may be controlled by the internal logic while another portion is controlled according to register settings. In any case, the transmission gates may be controlled by a controller, and here controller 99 may be operating all the switching components (namely in this example switching components 4A-4D and 5A-5D) to share access to the bus lines (and provide pad interconnections and internal component interconnections as needed).

In the present example, the I/O ports 2A-2D and 3A-3D are general purpose I/O ports. In other examples, any I/O ports can be used. Furthermore, the principles described above can be applied independently of I/O ports. For example, on-chip circuit components can be connected to the bus lines and the bus lines may or may not also connect to I/O ports.

Although the bus lines 11-14 are referred to as "analog" bus lines, meaning that these bus lines have transmission characteristics selected for analog transmissions, in some examples to send digital signals may be sent in through the pads. For example, a digital signal may be sent over one of the pads to an internal DAC, and then sent back as an analog signal over the same or another one of the bus lines 11-14 to a different pad, for example.

As discussed in greater detail in co-pending U.S. patent application Ser. No. 12/496,590, entitled "Multifunction Input/Output Circuit", which is herein incorporated by reference in its entirety, a multifunction I/O interface cell and controller can allow an I/O pad to be used for multiple purposes depending on the settings of the controller. It should be appreciated that each of the I/O pads described herein can be selectively connected to their respective bus lines through the multifunction I/O interface cell to expand configurability.

Figure 1B:
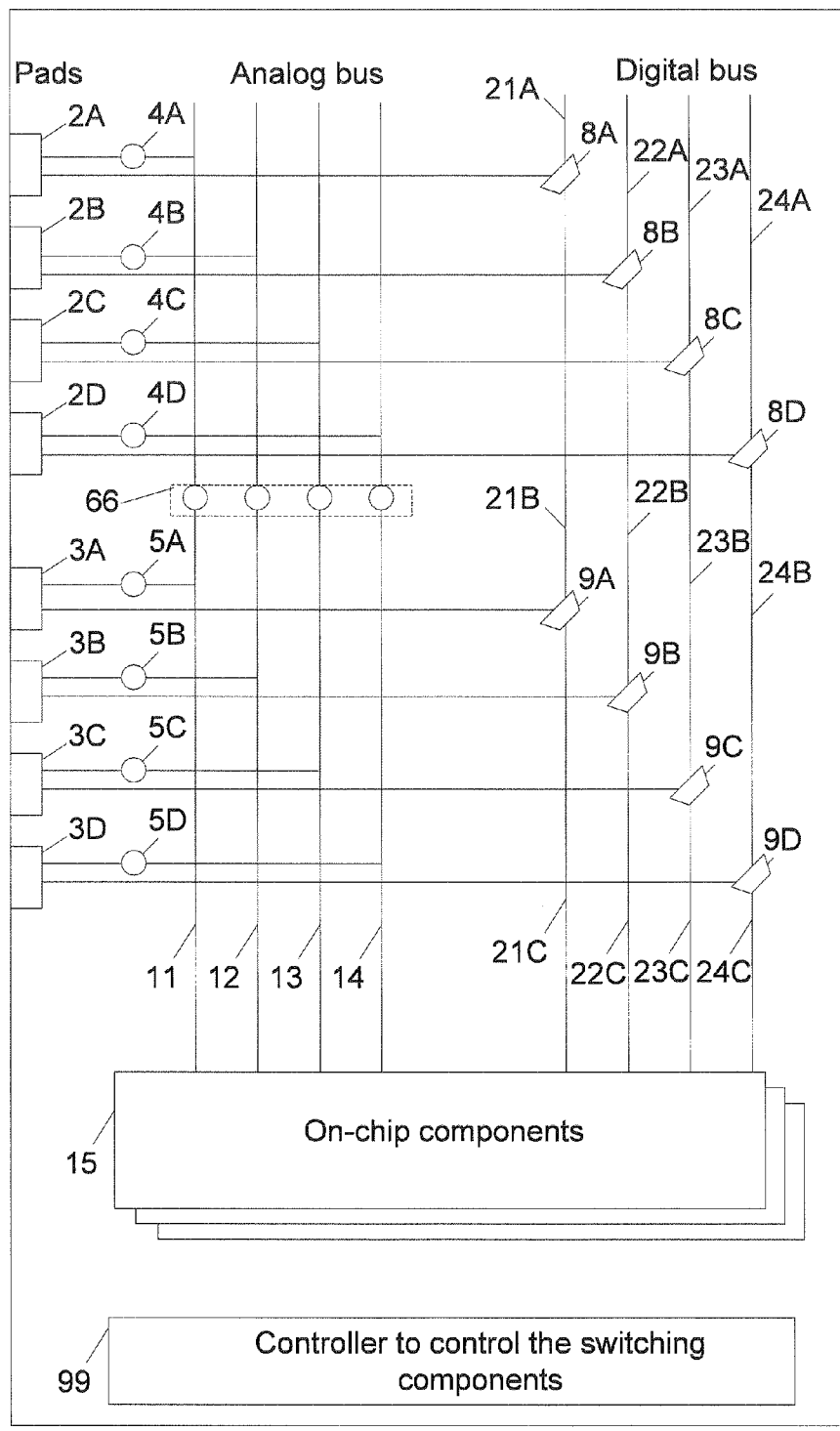
FIG. 1B shows a variation of the system of FIG. 1A utilizing a plurality of switches to share analog and digital lines between I/O ports in an embodiment.

FIG. 1B shows a variation of the system of FIG. 1A utilizing a plurality of switches to share analog and digital bus lines between I/O ports in an embodiment.

The variant system of FIG. 1B utilizes logic gates 8A-D and 9A-D to selectively connect the pads 2A-D and 3A-D to each other and internal digital components via digital bus lines 21A-C, 22A-C, 23A-C, and 24A-C. In the present example, the logic gates 8A-D and 9A-D are multiplexers, although in other examples different types of logic gates may be used.

The two-to-one multiplexer 8A receives inputs including the connection extending to pad 2A and the digital bus line 21A. The multiplexer 8A output is connected to digital bus line 21B, which could then be directly connected to an internal digital component (or even selectively connected to one of a plurality of digital components). The same digital bus line 21B is then fed into an input of the multiplexer 9A, as shown.

Similar to the previously discussed dashed box 66, the digital side may be modified to include logic gates along the bus lines 21B, 22B, 23B, and 24B. Such logic gates could be tri-state drivers, instead of the two-to-one multiplexors.

Figure 1C:
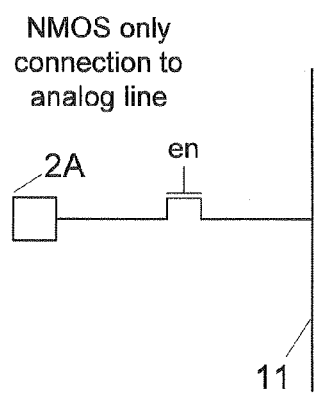
FIG. 1C illustrates examples of the switching components located on the analog lines of the system shown in FIGS. 1A and 1B in an embodiment.
Figure 1C:
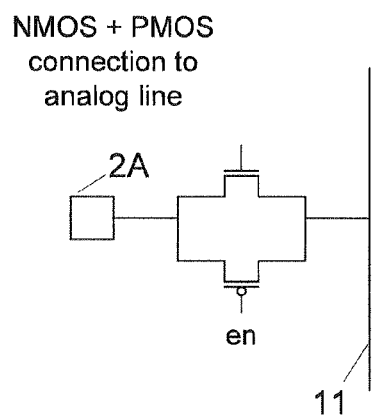

FIG. 1C illustrates examples of the switching components located on the bus lines of the system shown in FIGS. 1A and 1B in an embodiment.

The transmission gates 4A-D and 5A-D shown in FIG. 1A may be of any type. One possible type of transmission gate is the NMOS transistor of FIG. 1C. The type of transmission gate may be selected based on the expected characteristics of the signals to be connected to the pad 2A.

If the different signals that may be connected to the pad 2A have a wide range of operating characteristics, then transmission gates connected in parallel for the switching components may be utilized. For example, if the pad 2A may provide high or low voltage signals depending on register settings, the switching component selectively connecting the pad 2A to the bus line 11 may be an NMOS and PMOS transistor connected in parallel. This concept may be extended to add additional transistor types in parallel according to the characteristics of the signals received over I/O pads.

Figure 1D:
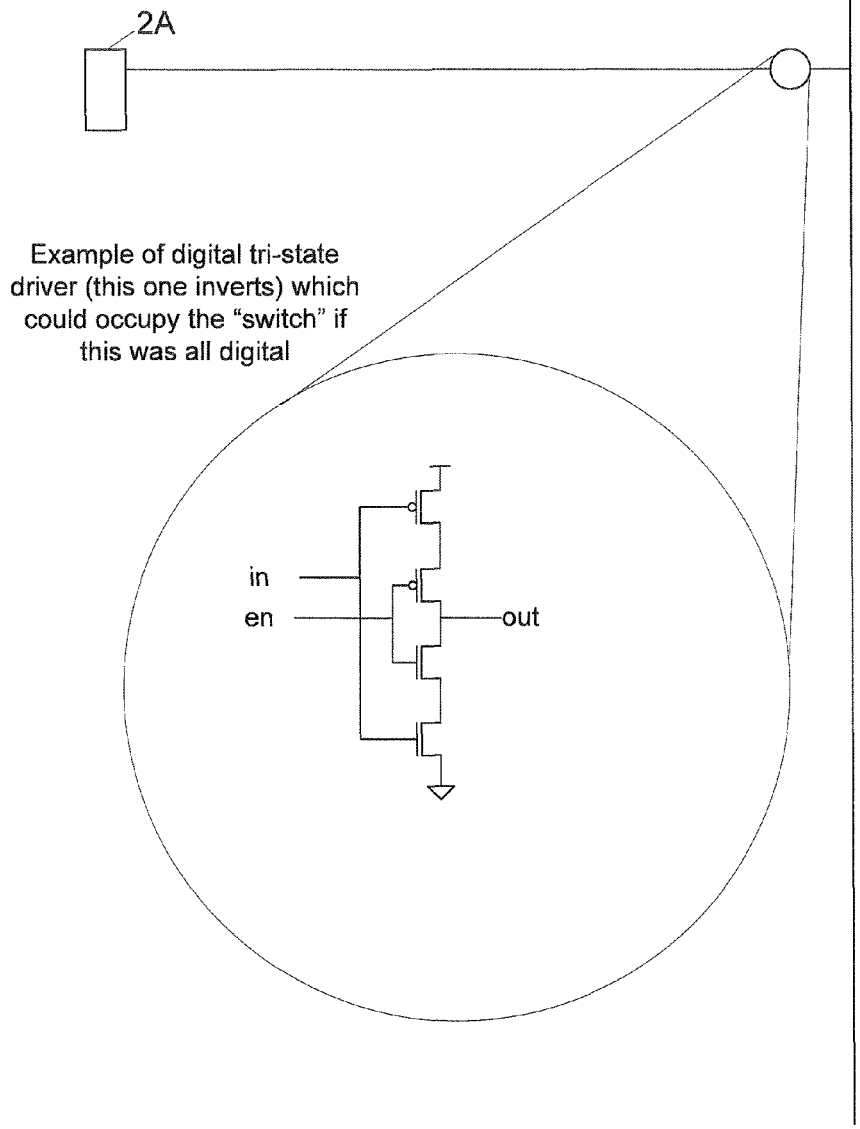
FIG. 1D illustrates an alternative example of the switching component located on the digital lines of the system shown in FIG. 1B in an embodiment.

FIG. 1D illustrates an alternative example of the switching component located on the digital bus lines of the system shown in FIG. 1B in an embodiment.

As discussed previously, the logic gates used for the switching components of FIG. 1B are not limited to a multiplexer. The digital tri-state driver illustrated in FIG. 1D may also be used for selectively connecting the I/O pads to the digital bus lines. One difference between the digital tri-state driver and the multiplexer example is that the digital tri-state driver selectively connects the pad 2A to a single bus line, instead of two sub bus lines.

The input of the tri-state driver is connected to the pad 2A, while the output is connected to a digital bus line. The enable is driven by the controller 99. In the present example the tri-state driver is an inverter, e.g. if enabled, the illustrated tri-state driver outputs a low signal when receiving a high signal. In other examples, a non-inverting tri-state driver can be used.

Figure 2:
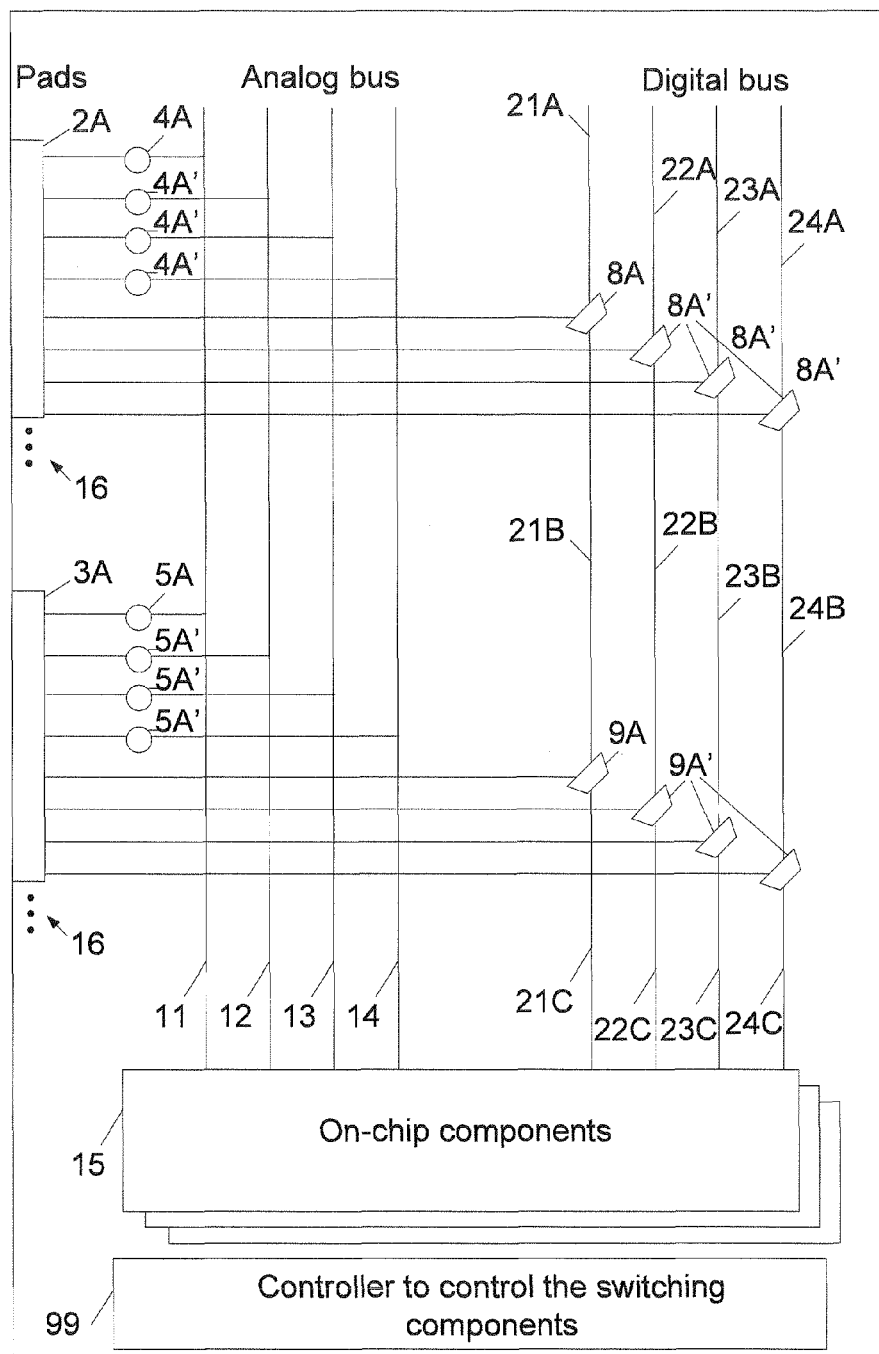
FIG. 2 shows a system similar to the system shown in FIG. 1A but having additional switching components in an embodiment.

FIG. 2 shows a system 101 similar to the system shown in FIG. 1A but having additional switching components in an embodiment.

The system 101 includes pads 2A and 3A. The ellipses 16 represent the other pads, which are not shown for ease of illustration.

The pad 2A can be selectively connected to more than one of the bus lines, due to the additional switching components 4A'. In the example, the number of analog switching components (e.g. including 4A and 4A') corresponding to the pad 2A is equal to the number of bus lines. In other examples, there may be less of the additional switches 4A', such as one switch to provide pad 2A with access to one of the other bus lines 12-14. The exact number and placement of the additional analog switches 4A' may depend on specifications and capability. A similar concept can be extended to the digital bus lines 21-24, e.g. the addition of digital switching components 8A'.

It is noted that the number of additional switches corresponding to each pad, for example the number of switches 4A' corresponding to pad 2A, can be different than to another pad, for example the number of switches 5A' corresponding to pad 3A. For that matter, some pads may have additional switches while other pads do not have any additional switches. The exact number and placement of the additional switches 4A', 5A', 8A', and 9A' may depend on specifications and capability.

Figure 3:
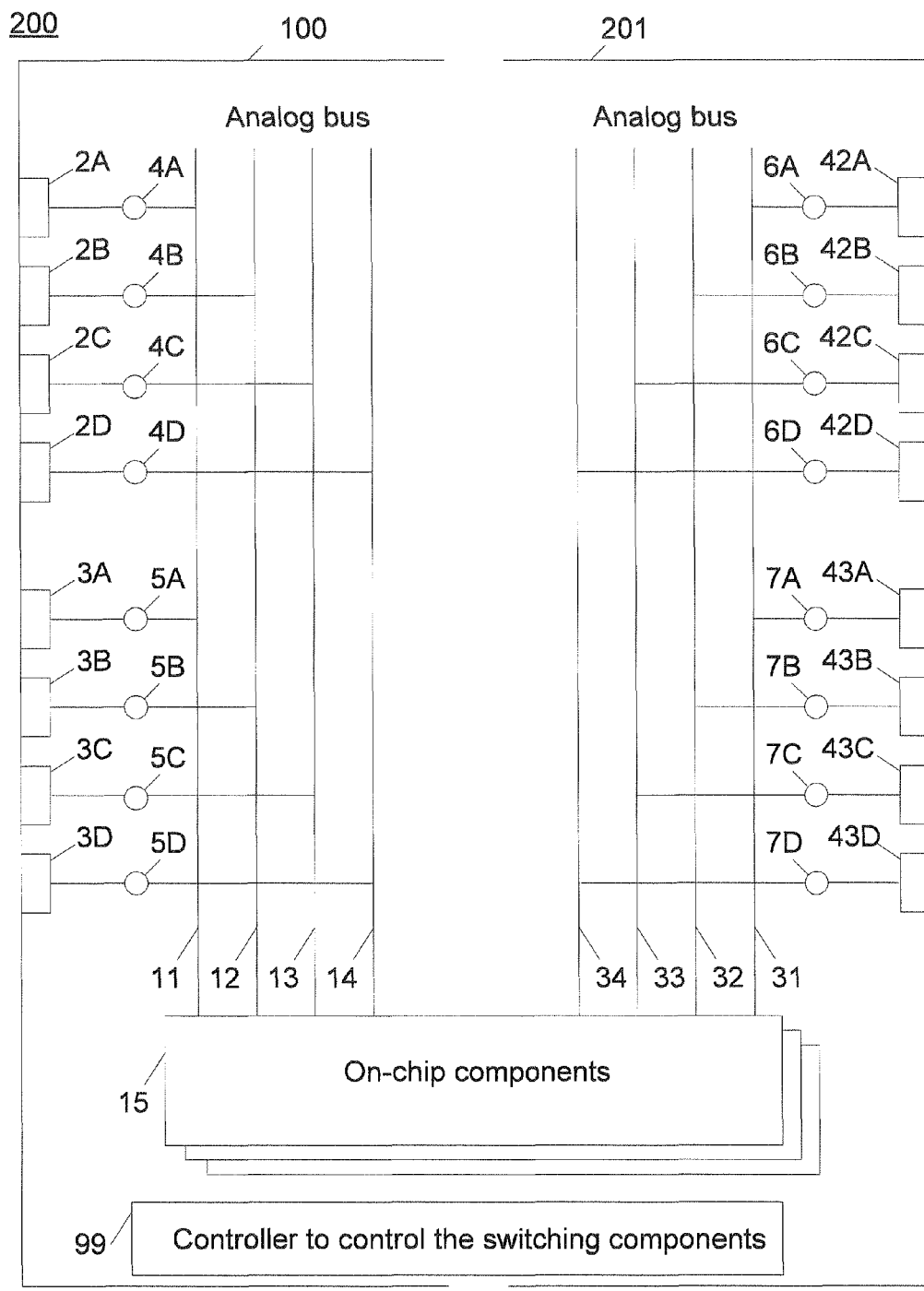
FIG. 3 shows a system utilizing a plurality of bus networks in an electronic device in an embodiment.

FIG. 3 shows a system utilizing a plurality of bus networks in an electronic device in an embodiment.

In this case, two sets of four-line bus networks are shown, in systems 100 and 201 of common chip 200. In this example, the second system 201 may have the same or different number of bus lines 31-34, I/O ports 42A-D and 43A-D, and switches 6A-D and 7A-D. The four additional bus lines are 31-34, which connect to I/O ports 42A-D and 43A-D. By using two separate shared bus networks, the length of bus lines on the circuit may be reduced, which may optimize performance and size. While FIG. 3 shows an example with two shared bus networks, a device may have any number of shared networks.

Figure 5A:
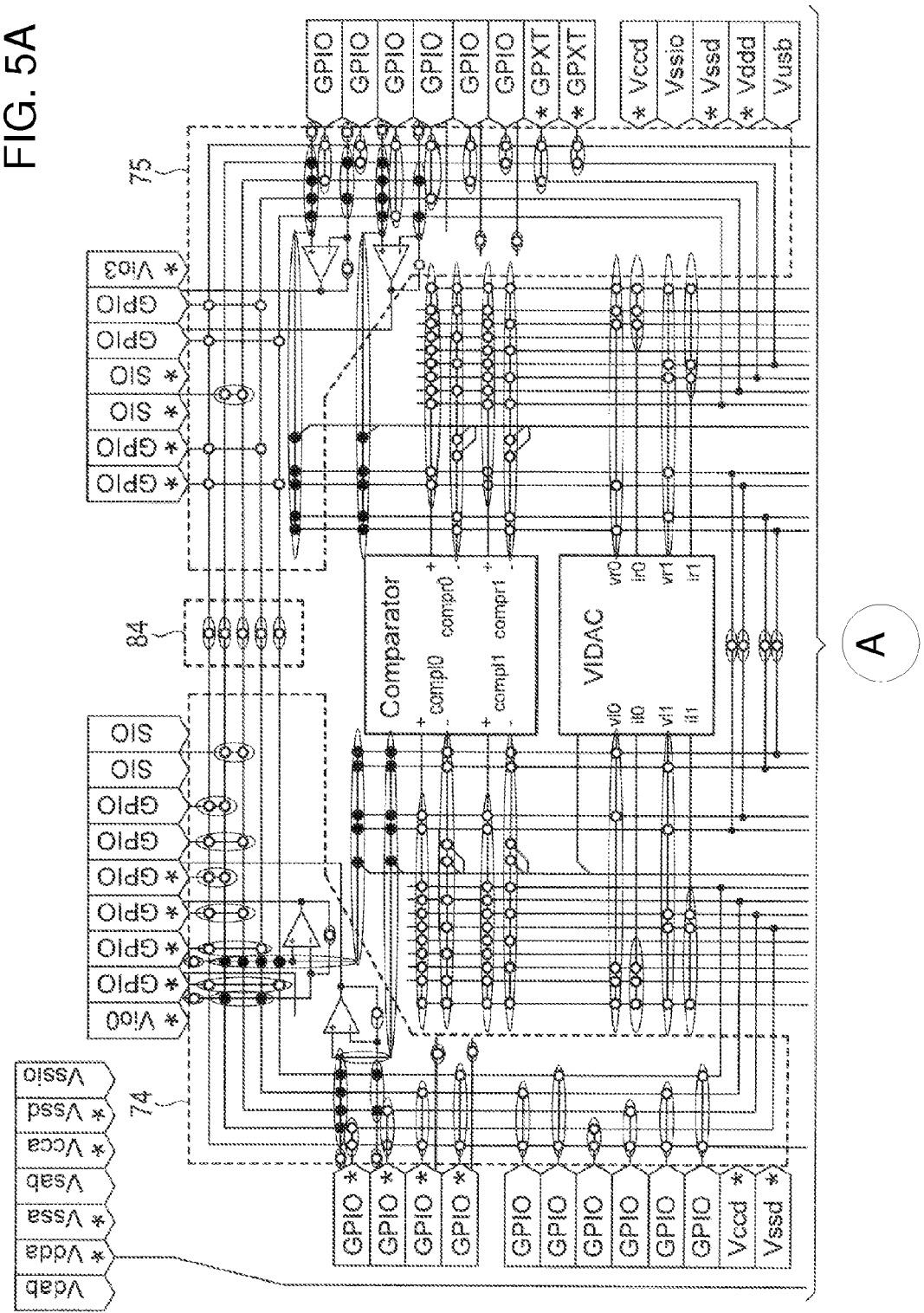
FIG. 5 shows an example circuit utilizing a bus sharing scheme in an embodiment.
Figure 5B:
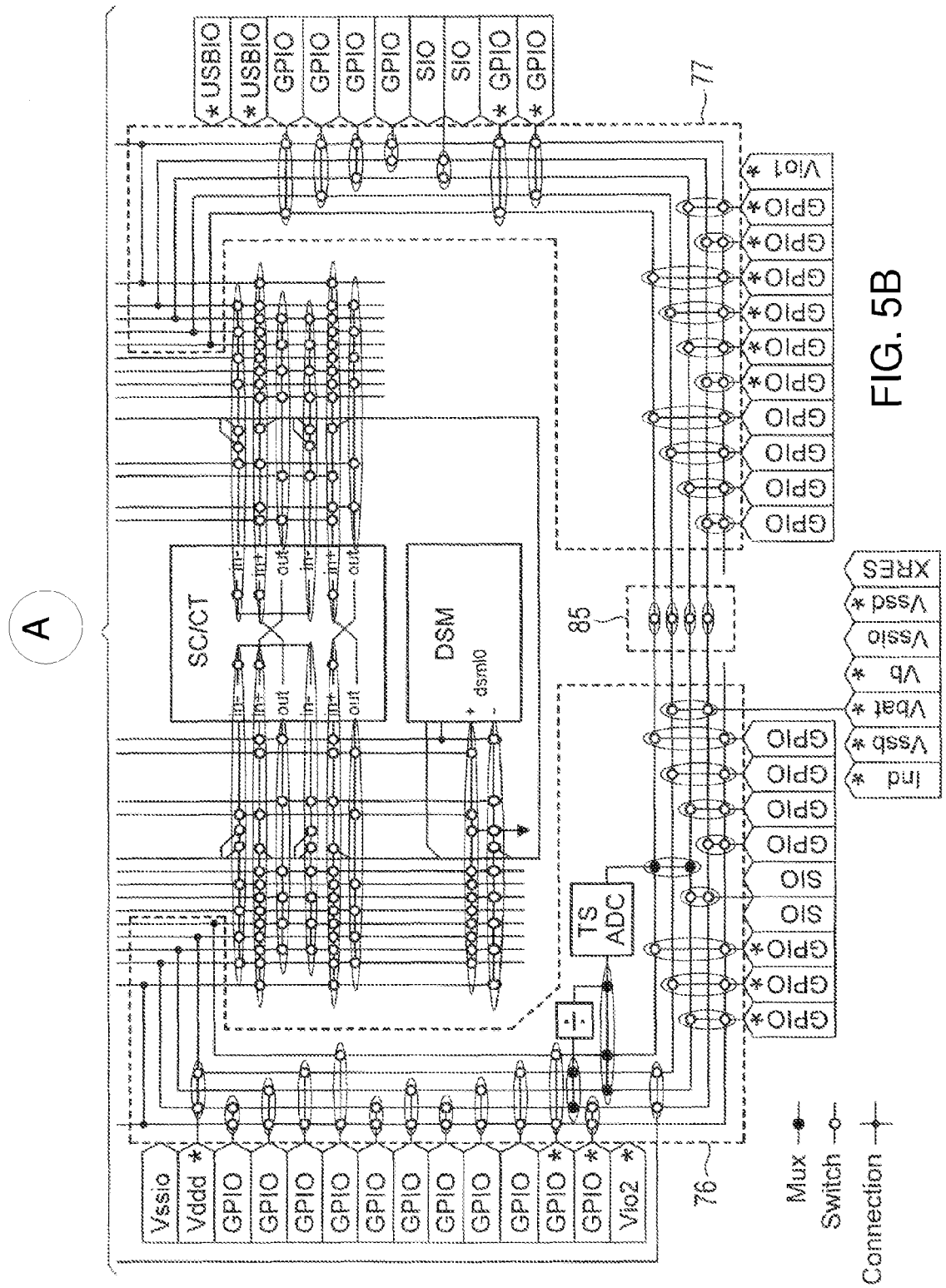

Referring now to FIGS. 3 and 5 in combination, the example circuit shown in FIG. 5 illustrates the concept of separate networks of shared buses, as discussed above. In this example circuit of FIG. 5, there are four shared bus networks 74, 75, 76, and 77. For example, the upper networks 74 and 75 are separated from the lower two networks 76 and 77.

Figure 4A:
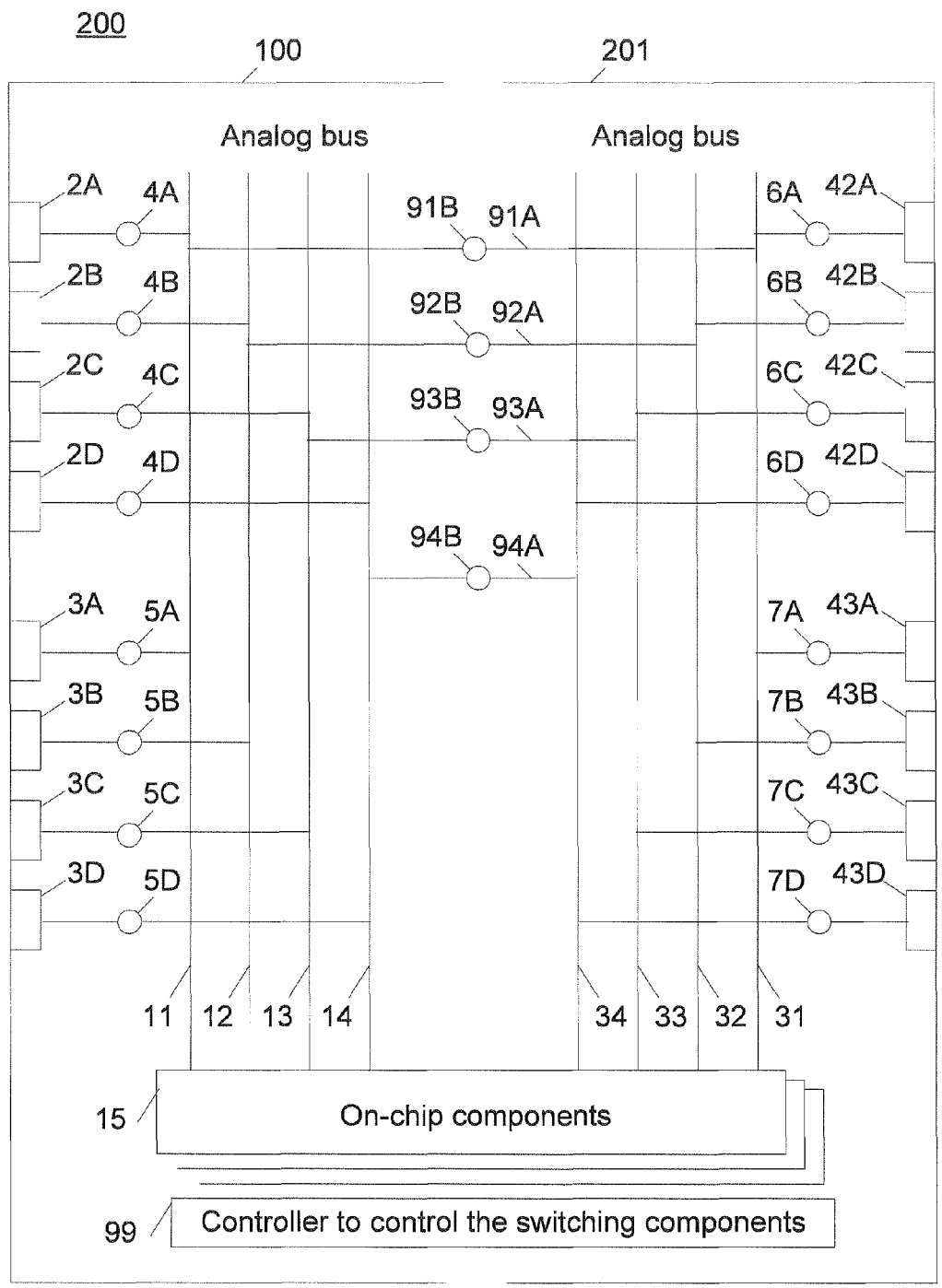
FIG. 4A shows a system similar to the system shown in FIG. 3 but having additional switching components in an embodiment.

FIG. 4A shows a system similar to the system shown in FIG. 3 but having additional switching components in an embodiment.

The addition of connections 91A, 92A, 93A, and 94A, as well as the switching components 91B, 92B, 93B, and 94B, allows two separate networks of shared buses of the same chip 200 to be selectively connected. For example, switch 91B may be closed to connect pad 2A to pad 42A. It should be apparent that this allows two sub-wires to operate separately within different networks of buses at one time. At another time, the two sub-wires are combined to become one global wire extending between the different networks of buses.

Referring now to FIGS. 4A and 5 in combination, the example circuit shown in FIG. 5 illustrates the concept of selectively connected networks of shared buses, as discussed above. The vertically oriented line of switches 84 in the top middle of the example circuit of FIG. 5 selectively connects shared bus networks 74 and 75. The vertically oriented line of switches 85 in the bottom middle of the example circuit of FIG. 5 selectively connects shared bus networks 76 and 77.

Figure 4B:
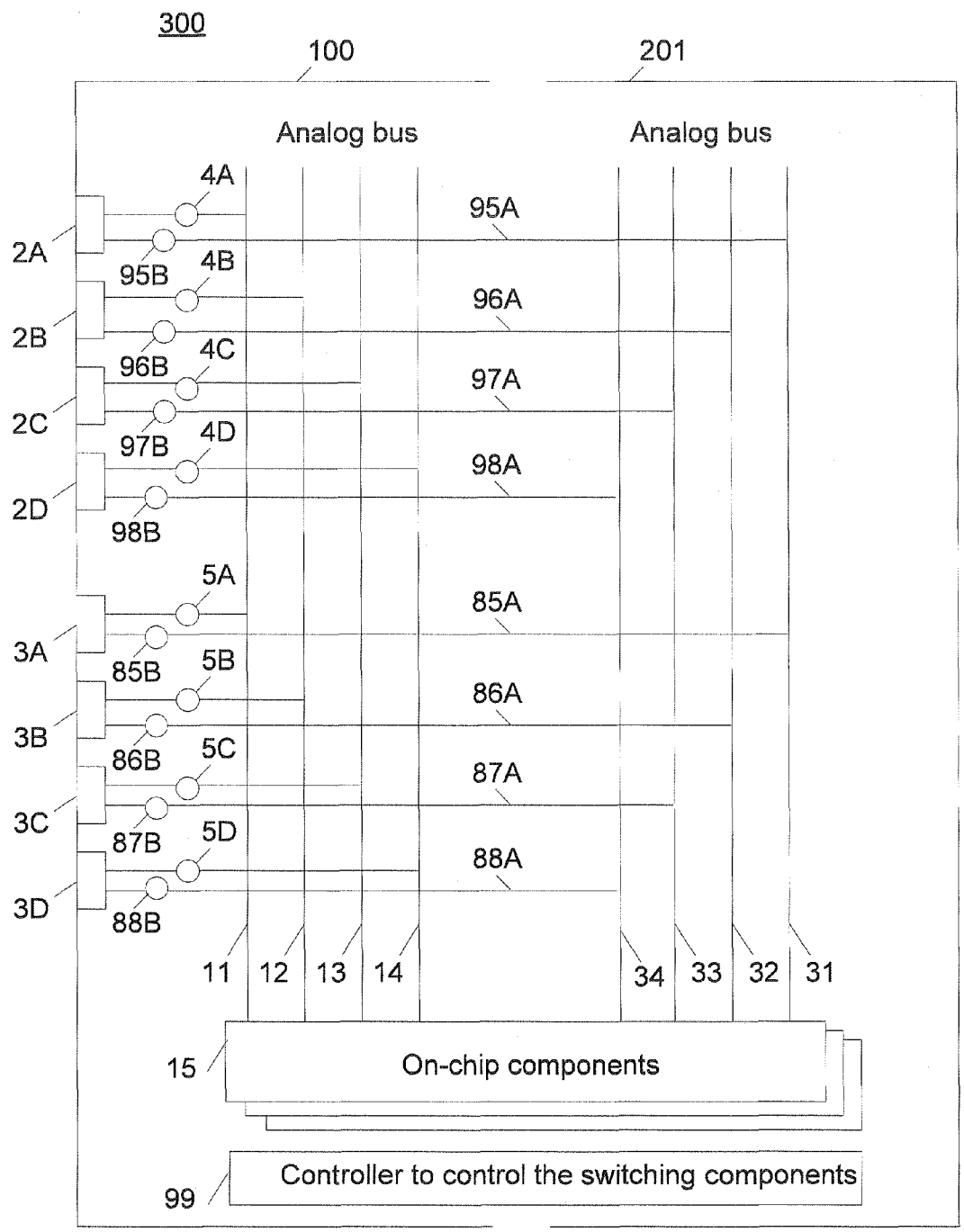
FIG. 4B shows a variation of the system of FIG. 4A in an embodiment.

FIG. 4B shows a variation of the system shown in FIG. 4A in an embodiment.

The FIG. 4B shows a variant system 300 similar to the system 200. In the system 300, each pad 2A-D and 3A-D is selectively connected to both of the buses of the different bus networks. For example, pad 2A is selectively connected to bus line 11 via switching component 4A, and also selectively connected to bus line 31 via switching component 95B (using connection 95A).

Thus, the pad 2A may connect to more than one bus network at the same time. This may be useful, for example, if bus line 11 were unavailable, pad 2A could temporarily "borrow" a bus line 31 of another bus. The bus of bus lines 31-34 may be a bus typically used by other pads (as shown in FIG. 4A), or a bus that is used by internal components and not typically used by other pads (as shown in FIG. 4B).

The other connections 96A, 97A, 98A, 85A, 86A, 87A, and 88A, as well as the other switching components 96B, 97B, 98B, 85B, 86B, 87B, and 88B, may provide selective connections as shown. Such selective connections may be all controlled by the controller 99, as previously discussed.

Several examples have been described above with reference to the accompanying drawings. Various other examples are also possible and practical. The system may be exemplified in many different forms and should not be construed as being limited to the examples set forth above.

The figures listed above illustrate examples of the application and the operation of such examples. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the examples to those skilled in the art. Those parts and elements not shown may be conventional and known in the art.

The system described above can use dedicated processor systems, micro controllers, programmable logic devices, or microprocessors that perform some or all of the operations described herein. For example, any of such devices may be used to control switching in a shared bus scheme. Some of the operations described above may be implemented in software and other operations may be implemented in hardware.

What is claimed is:

1. A programmable device, comprising:
   an analog component coupled with a first analog bus of the device;
   a digital component coupled with a digital bus of the device; and
   a first plurality of IO pads each selectively coupled to at least one analog bus line of a first segment of the first analog bus by a first type of switch and to at least one digital bus line by a second type of switch different from the first type of switch, wherein the first analog bus is configured to selectively couple at least two of the IO pads to each other.

2. The device of claim 1, further comprising a second plurality of IO pads each selectively coupled to at least one analog bus line of a second segment of the first analog bus, wherein the at least one analog bus line of the first analog bus segment is configured to connect to the at least one analog bus line of the second segment of the first analog bus.

3. The device of claim 1, further comprising a second plurality of IO pads each selectively coupled to at least one analog bus line of a second analog bus, wherein at least one bus line of the first analog bus is selectively coupled to at least one bus line of the second analog bus.

4. The device of claim 1, further comprising:
   a second plurality of IO pads each selectively coupled to at least one analog bus line of a second analog bus; and
   a third analog bus comprising at least one analog bus line selectively coupleable to at least one analog bus line of the first analog bus and to at least one analog bus line of the second analog bus.

5. The device of claim 1, further comprising a second analog bus, wherein each of the first plurality of IO pads is selectively coupled to at least one analog bus line of the second analog bus.

6. The device of claim 1, further comprising a controller configured to dynamically reconfigure the selective coupling of at least one IO pad to the at least one analog bus line.

7. The device of claim 1, wherein the analog component is selected from the group consisting of an ADC, a DAC, a comparator, an internal amplifier and a filter.

8. The device of claim 1, wherein the IO pads are selectively coupled to the at least one analog bus line by an analog switch.

9. The device of claim 1, wherein the IO pads are selectively coupled to the at least one digital bus line by a logic gate.

10. The device of claim 1, wherein at least one IO pad of the plurality of IO pads is selectively coupleable to at least two analog bus lines of the first analog bus.

11. A method of operating a device, comprising:
    configuring an analog component to communicate over a first analog bus of the device;
    configuring a digital component to communicate over a digital bus of the device;
    coupling a first IO pad to a bus line of a first segment of the first analog bus by a first type of switch and to at least one digital bus line by a second type of switch different from the first type of switch; and
    coupling a bus line of a second analog bus to the bus line of the first segment of the first analog bus.

12. The method of claim 11, further comprising:
    coupling a second IO pad to a bus line of a second segment of the first analog bus; and
    coupling the bus line of first segment of the first analog bus to a bus line of the second segment of the first analog bus.

13. The method of claim 11, further comprising coupling a bus line of a third analog bus to the bus line of the segment of the first analog bus.

14. The method of claim 11, further comprising configuring a controller to dynamically reconfigure the coupling of the first IO pad to the bus line of the first analog bus.

15. The method of claim 11, further comprising selecting the function of the analog component from the group consisting of: and ADC, a DAC, a comparator, internal amplifiers and filters.

16. The method of claim 11, wherein the coupling of the first IO pad to the bus line of the first analog bus comprises configuring an analog switch.

17. The method of claim 11, wherein the coupling of the first IO pad to the bus line of the digital bus comprises configuring a logic gate.

18. A method, comprising:
- providing an analog component coupled with a first analog bus of a device;
- providing a digital component coupled with a digital bus of the device; and
- providing a first plurality of IO pads each selectively coupled to at least one analog bus line of a first segment of the first analog bus by a first type of switch and to at least one digital bus line by a second type of switch different from the first type of switch,
- wherein the analog bus is configured to selectively couple at least two of the IO pads to each other.

19. The method of claim 18, further comprising providing a second plurality of IO pads each selectively coupled to at least one analog bus line of a second segment of the first analog bus, wherein at least one bus line of the first analog bus segment is configured to connect to at least one bus line of the second segment of the first analog bus.

20. The method of claim 18, further comprising providing a second analog bus, wherein each of the first plurality of IO pads is selectively coupled to at least one analog bus line of the second analog bus.

* * * * *